United States Patent

Magera et al.

[11] Patent Number: 5,856,068
[45] Date of Patent: Jan. 5, 1999

[54] METHOD FOR FABRICATING A PRINTED CIRCUIT BOARD BY CURING UNDER SUPERATMOSPHERIC PRESSURE

[75] Inventors: Yaroslaw Antin Magera, Algonquin; Everett Furber Simons, Palatine, both of Ill.

[73] Assignee: Motorola, Inc., Schaumburg, Ill.

[21] Appl. No.: 850,791

[22] Filed: May 2, 1997

[51] Int. Cl.⁶ .................................................. G03F 7/26
[52] U.S. Cl. ........................... 430/312; 430/315; 430/330
[58] Field of Search .................................. 430/311, 312, 430/313, 315, 324, 330, 394

[56] References Cited

U.S. PATENT DOCUMENTS

| | | | |
|---|---|---|---|
| 4,902,610 | 2/1990 | Shipley | 430/315 |
| 5,149,615 | 9/1992 | Chakravorty | 430/313 |
| 5,162,144 | 11/1992 | Brown et al. | 428/209 |
| 5,229,257 | 7/1993 | Cronin | 430/315 |
| 5,246,817 | 9/1993 | Shipley, Jr. | 430/312 |
| 5,260,170 | 11/1993 | Brown | 430/312 |

*Primary Examiner*—Kathleen Duda
*Attorney, Agent, or Firm*—Douglas D. Fekete; John B. MacIntyre

[57] ABSTRACT

A process for fabricating a multilayer printed circuit board, in which interlayer adhesion of the layers is greatly enhanced by curing under superatmospheric pressure. The method generally includes depositing a first resin layer (12) onto a substrate (10), which is then patterned so as to cross-link a preselected portion of the resin layer (12). A second resin layer (18) is then deposited over the first resin layer (12), and then patterned to cross-link a portion thereof. Openings in the first and second resins are developed by removing those portions of the resins that were not cross-linked during patterning. Openings (26) in the second resin layer (18) provide access to the first resin layer (12) by subsequent chemical processes. The portions of the first (12) and second (18) resin layers cross-linked during patterning remain on the substrate (10) to form permanent dielectric layers. The first resin layer (12) preferably includes a filler catalytic to plating, thereby enabling direct plating of the first resin layer (12) to form metal features within the multilayer structure. The process yields a multilayer printed circuit board that exhibits increased interlayer adhesion subsequent to plating caused by curing the first and second resin under superatmospheric pressure.

24 Claims, 1 Drawing Sheet

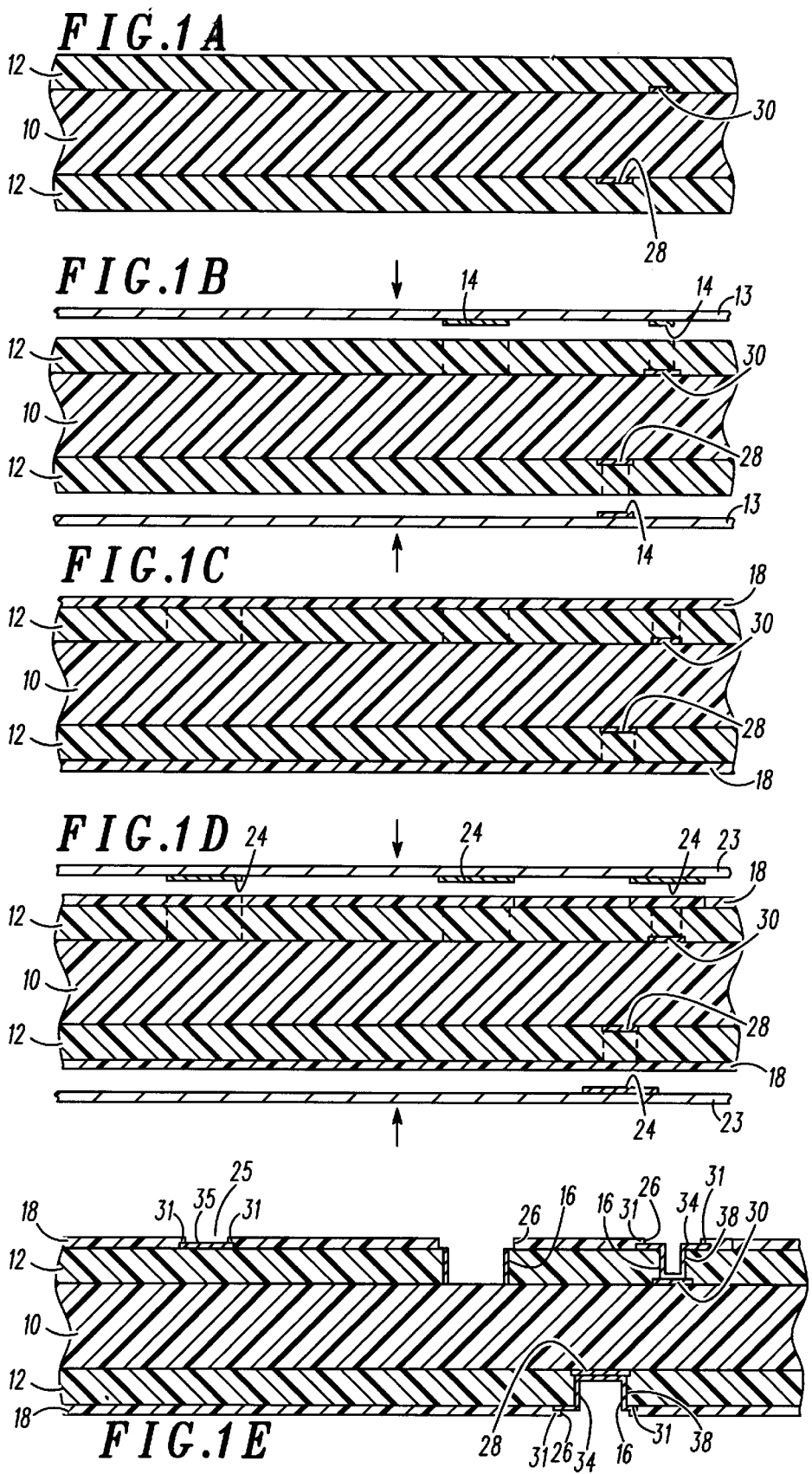

METHOD FOR FABRICATING A PRINTED CIRCUIT BOARD BY CURING UNDER SUPERATMOSPHERIC PRESSURE

FIELD OF THE INVENTION

The present invention generally relates to printed circuit boards and their fabrication. More particularly, this invention relates to a method for fabricating sequentially-deposited dielectric layers of a printed circuit board, in a manner that improves interlayer and conductor adhesion.

BACKGROUND OF THE INVENTION

The fabrication of multilayered circuit boards is generally accomplished by depositing a sequence of dielectric and conductor layers. Metallized openings in the dielectric layers, commonly referred to as vias, extend through the dielectric layers in order to electrically interconnect the conductor layers as required. One method that has been suggested to facilitate the fabrication of multilayer circuit boards employs a radiation-sensitive dielectric coating material that is sequentially deposited to form permanent dielectric layers of a multilayer circuit, with vias that are photochemically patterned in the dielectric layers. These vias facilitate electrical connections between two or more conductor layers. A conductor pattern is then formed on the outer dielectric layer using conventional circuit board processes. As permanent dielectric layers of the circuit board, the coating material remains within the multilayer structure to electrically insulate adjacent conductor layers in all areas other than the via sites.

Another process for the manufacture of multilayered circuits entails sequential deposition of a plateable resin layer followed by a non-plateable resin layer. The two resins are preferably photo-definable, and the photo-definition of the two resin layers produces openings through which metal features of a circuit layer are formed. The first resin may include a catalytic filler that can be activated to enable electroless-plating of the resin with a metal, or may be surface catalyzed. The second resin does not contain a catalytic filler. The first and second resins are sequentially deposited and photochemically patterned, with the second resin overlying the first resin such that openings in the second resin expose regions of the first resin. These exposed areas of the first resin are then electrolessly plated to form metallic features such as pads, vias and conductors. In this manner, multiple circuit layers can be sequentially formed to produce a desired multilayer printed circuit board.

It has been suggested to fabricate a multilayer printed circuit board by depositing a first resin onto a metallically-patterned substrate. The first resin layer is then photodefined and a second resin layer is deposited on the first resin layer. The second resin layer is then photodefined. Openings in the first and second resin layers are developed by dissolving those portions of the resins that were not cross-linked during a patterning step. These exposed areas of the first resin are then electrolessly plated to form metallic features such as pads, vias and conductors. Alternatively, a laser can be used to drill the via openings through the deposited dielectric layers.

However, with any of the prior art methods, it is desired to increase the adhesion of the conductor and the resin layers to strengthen the multilayer circuit board. Therefore, a need exists for a method for forming a multilayer printed circuit board that provides enhanced interlayer adhesion strength.

BRIEF DESCRIPTION OF THE DRAWINGS

FIGS. 1A through 1E represent processing steps for depositing and developing two dielectric resin layers of a printed circuit board in accordance with a preferred embodiment of this invention.

DETAILED DESCRIPTION OF A PREFERRED EMBODIMENT

According to the present invention, a method is provided for fabricating a multilayer printed circuit board in which a first resin layer is deposited onto a substrate. The first resin layer is formed of a first photo-definable resin and is patterned and partially cured to partially cross-link a portion of the first resin layer. The first resin layer is then developed by dissolving the portions that were not cross-linked to create openings in the first resin layer. The coated substrate is then chemically treated to roughen and catalyze the first resin layer. A second resin layer is deposited on the first resin layer and is patterned to partially cross-link a portion of the second resin layer. The second resin layer is then developed to form openings in the second resin by removing portions of the resin that were not cross-linked during the patterning step. The portions of the first and second resin layers that were cross-linked during the patterning steps remain on the substrate.

The resin coated substrate is then chemically treated to electrolessly plate copper on the areas of the first resin layer that are not masked by the second resin layer. The first and second resins are then cured under heat and superatmospheric pressure, preferably above about 1 Mega Pascal (MPa) (about 9.9 atmospheres, or about 145 pounds per square inch), to form a substantially polymerized monolithic structure having increased adhesion strength between the layers of resin and to the electrolessly plated copper. This increased adhesion strength is a result of the cure being done under superatmospheric pressure.

The present invention is directed to a method for forming a printed circuit board that exhibits increased mechanical robustness, particularly in the interlayer connections. Layers of resin are patterned and developed in such a way that the definition and precision of openings in the resin layers are enhanced.

Referring to FIG. 1A, a substrate 10 is shown on which a pair of metal pads 28 and 30, typically formed of copper or a copper alloy, have been previously formed. The substrate 10 can be formed from any suitable insulating material, such as plastic, composite, MYLAR, ceramic, or any other suitable electrically insulating material. Shown overlying opposing surfaces of the substrate 10 are a pair of resin layers 12. According to a preferred embodiment of this invention, the resin layers 12 are composed of a photodefinable resin disclosed in U.S. Pat. No. 5,162,144 to Brown et al., which is commonly assigned with this invention and incorporated herein by reference.

The photosensitive material content of the resin mixture results in resin layers 12 being photodefinable, such that photoimaging and development techniques can be employed to pattern openings in layers 12. The resin component of the resin mixture can be any suitable liquid resin or solid resin dissolved in a solvent so as to enable the resin mixture to be readily deposited onto the surface of the substrate 10 to form the resin layers 12. Alternatively, the resin layers 12 could be in the form of a dry film material. Resins that could be used include thermoplastic resins, thermosetting resins, elastomers and mixtures thereof, which can be mixed with a photosensitive material that yields a photodefinable resin mixture. A suitable composition for the resin layers 12 is a photodefinable resin available from Ciba-Geigy, Inc., under the trademark PROBIMER 61.

The manner in which resin is deposited to form the resin layers 12 will depend to some degree on the particular resin mixture. Due to the presence of the photosensitive material, openings in the resin layers 12 can be photodefined through photomasks 13, as portrayed in FIG. 1B. As shown, the photomasks 13 expose preselected portions of the resin layers 12 to ultraviolet radiation (indicated by arrows in the FIGS.), while opaque areas 14 shield other regions of the layers 12, including portions of the resin layers 12 that overly metal pads 28 and 30. While FIG. 1B illustrates the regions of the resin layers 12 shielded by the opaque areas 14 as corresponding to about one-half the size of the respective metal pads 28 and 30, a larger or smaller region of each resin layer 12 could be shielded.

During exposure, the photosensitive material is activated such that an appropriate thermal treatment of the resin layers 12 following exposure will cause partial cross-linking of the resin material in those regions exposed to ultraviolet radiation, rendering those regions of the layers 12 strong enough to withstand the subsequent operations. As used herein, partially cured refers to a resin layer in which at least 30% and not more than 50% of the reactive groups are reacted.

Following the above steps, second resin layers 18 are deposited over their respective first resin layers 12, as shown in FIG. 1C. If desired, the resins used to form the layers 12 and 18 can differ, and thereby have different bulk electrical properties, such as capacitive, conductive and magnetic properties. As was done when patterning the first resin layers 12, and as shown in FIG. 1D, photomasks 23 are placed over second resin layers 18 such that opaque areas 24 shield preselected regions of the second resin layers 18 while permitting the remaining regions of the second resin layers 18 to be exposed to ultraviolet radiation. As shown, the shielded portions of the resin layers 18 include regions that overlay the metal pads 28 and 30 on the substrate 10 and also a region where a metal contact is desired. After the second photosensitive resin layers 18 have been activated by the selective exposure to ultraviolet radiation, thermal treatment of the resin layers 18 causes partial cross-linking of the resin in those regions exposed to ultraviolet radiation, such that the resin layers 18 can withstand the development process which follows.

To create the multi-layer structure shown in FIG. 1E, openings 26 and 16 are developed in the resin layers 18 and 12 with an appropriate developer solution of a type known in the art. The portions removed from the resin layers are those that were not exposed to ultraviolet radiation during either of the exposures, including those regions of the first and second resin layers 12 and 18 overlying the metal pads 28 and 30. Openings 26 in the second resin layers 18 are superimposed over openings 16 in the first resin layers 12 in order to provide access to the first resin layers 12. Opening 25 is located such that a metal contact 35 may be formed on first resin layer 12. Following development of resin layers 18 and 12 to create openings 26 and 16, respectively, the resin coated substrate 10 is chemically treated to electroless copper plate the areas of first resin layer 12 that are not masked by second resin layer 18, as disclosed in U.S. Pat. No. 5,162,144 to Brown et al. Resin layers 12 and 18 then undergo an appropriate cure so as to form a fully polymerized monolithic structure.

In the present invention, the cure is carried out at superatmospheric pressure. The board is placed in a chamber that is preferably pressurized to a pressure above about 1 Mega Pascal (MPa) (about 9.9 atmospheres, or 145 psi). In a preferred embodiment, the chamber is pressurized above 2 MPa (about 20 atmospheres, or about 290 psi), and most preferably to about 2.4 MPa (about 24 atmospheres, or about 348 psi). The board can also be pressurized by placing it in a press and pressing the plates to the appropriate pressure.

The cure is preferably carried out at between about 100° C. and 200° C. In a preferred embodiment, the cure is carried out at about 175° C. The printed circuit board is placed in the chamber and is heated to about 175° C. over a twenty minute period. After this "ramp-up" period, the chamber is maintained at about 175° C. for about 20 minutes. The chamber is then cooled down to an ambient temperature over about a fifteen minute period. It should be recognized that this cure schedule can be modified depending upon the resin material selected and the processing limitations imposed.

Applicants have found that pressurizing the multilayer printed circuit boards during curing produces printed circuit boards that are structurally more robust than printed circuit boards formed using conventional techniques. Lips 31 are formed from second resin layers 18 and extend onto the exposed surface on the perimeter of metallized vias 34 and metal contact 35. Lips 31 are formed due to the pressure used during the curing process. In stud pull strength tests, control boards and test boards were formed using the aforementioned materials and processing steps.

Batches of test boards and control boards were formed using the described process. FR4 substrates were coated with PROBIMER 61 and selectively exposed to ultraviolet light. Second resin layers formed of PROBIMER 61 were then coated onto the first resin layers and selectively exposed to ultraviolet light. The test and control boards were then cured to form substantially polymerized structures. The test and control boards were heated to about 175° C. over a twenty minute ramp-up period and maintained at about 175° C. for about 20 minutes. The boards were then cooled to ambient temperature over about a 15 minute cool down period. The control boards were cured at atmospheric pressures. The test boards were cured under superatmospheric pressure to a pressure of about 2.4 MPa (about 24 atmospheres, or about 348 psi).

The panel size of the test and control printed circuit boards was 12 inches by 12 inches by 15 mil thick. The boards were scored into 500 mil by 500 mil squares. Each square had a 140 mil diameter copper pad centered on the face.

A z-axis pull test was used to determine the plated copper to dielectric adhesion. The equipment used was the SEBASTIAN FIVE-A tester equipped with the z-module and commercially available from The Quad Group of Spokane, Washington. The test pattern included 500 mil by 500 mil squares of a laminate with 140 mil diameter copper pads formed on the dielectric. An epoxy-coated stud was attached perpendicular to the copper pad. The epoxy, approximately 2 mils thick, is an ultra-strong, non-stressing, thermally cured epoxy bonding agent on the face of the stud and having an attachment strength of about 10 Kpsi. The face of the stud was 106 mils in diameter with a 63 mil shank and is 500 mil in length. A 500 mil by 500 mil epoxy coated alumina backing plate was attached to the other side of the laminate for additional support. The epoxy coating on the stud was cured at about 150° C. for about 1 hour. The shank of the stud was inserted into the gripper with the appropriate precautions taken to ensure a perpendicular pull. When the test was executed, the testing equipment applied a load at a predetermined rate. The delamination force was registered on the meter display and was recorded before the next test.

In the stud pull strength tests of boards formed using the aforementioned technique, the control printed circuit boards formed using the conventional method exhibited stud pull strengths of between about 20 and 30 MPa. Printed circuit boards formed using the present invention exhibited stud pull strength greater than 60 MPa, a significant increase in interlayer adhesion over printed circuit boards formed using conventional techniques.

While not limited to any particular theory, it is believed that the increased strength and interlayer adhesion of printed circuit boards formed using the present invention is attributed to additional cross-linking and metallurgical bonds formed due to the increased pressure during curing. The superatmospheric pressure also resists microscopic and macroscopic interlayer delamination due to any volatile species that exist within the structure or are generated during cure. This increased cross-linking leads to greater structural integrity and reliability, and allows printed circuit boards formed using the present invention to be stronger and more reliable.

Any one or more of the resin layers 12 and 18 (and any other subsequently-deposited resin layers) can be formulated to contain a catalytic filler, enabling selective plating of any of the surfaces of the resin layers 12 and 18. Finally, further processing steps can be pursued to form additional features of the circuit layer. For example, solder bumps could be formed on one or both of the metal pads 28 and 30 for attachment of an electronic component to the substrate 10, using the overlying resin layer(s) 12 and/or 18 as a solder mask.

While only two dielectric layers are shown in the FIGS. as being formed by resin layers 12 and 18, those skilled in the art will appreciate that after the metallization on resin layers 12 is complete, additional resin layers may be sequentially deposited, patterned, and developed and plated to yield additional dielectric and conductor layers having superimposed openings.

While the preferred embodiment details a second resin layer deposited onto a first resin layer, the present invention also increases interlayer adhesion of a metal layer formed onto a partially cured resin layer and cured under superatmospheric pressure.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A method for fabricating a printed circuit board, the method comprising the steps of:
    depositing a resin layer formed of a dielectric resin onto a substrate;
    plating a conductor pattern onto at least a portion of the resin layer; and
    heating at a temperature and for a time sufficient to cure said resin layer, said heating being carried out at superatmospheric pressure so as to form a substantially polymerized monolithic structure.

2. A method for fabricating a printed circuit board in accordance with claim 1, further comprising the step of patterning the resin layer prior to plating, said patterning creating an opening in the resin layer, said opening including an opening side wall that is plated during the step of plating.

3. A method for fabricating a printed circuit board in accordance with claim 2, further comprising the steps of:
    depositing a second resin layer on the resin layer prior to plating; and
    patterning the second resin layer so as to create an opening in the second resin layer such that the second resin layer forms a dielectric layer on the substrate and masks an area of the resin layer such that the step of plating plates in the opening in the second resin layer.

4. A method for fabricating a printed circuit board in accordance with claim 1, further comprising the steps of:
    depositing a second resin layer formed of a second resin that is formed of a photo-definable resin onto the first resin layer;
    patterning the second resin layer so as to at least partially cross-link a portion thereof; and
    developing an opening in the second resin layer by removing portions of the second resin layer that were not cross-linked during the patterning step, the portion of the second resin layer that was cross-linked during the patterning step remaining to form a dielectric layer on the substrate, such that the remaining area of the second resin forms a second dielectric layer on the substrate and masks an area of the resin layer such that the step of plating plates in the opening in the second resin layer.

5. A method for fabricating a printed circuit board in accordance with claim 4, further comprising the step of patterning the resin layer after the opening has been created in the second resin layer but prior to electroless plating to create an opening in the resin layer that is accessible through the opening in the second resin layer.

6. A method for fabricating a printed circuit board in accordance with claim 1, wherein the step of heating is carried out at a pressure above about 1 Mega Pascal.

7. A method for fabricating a printed circuit board in accordance with claim 1, wherein the resin layer contains a catalytic filler, the method further comprising the step of treating a surface region of the resin layer exposed by the opening in the second resin layer prior to the step of plating, said treating being effective to change the surface texture of the resin layer exposed by the opening in the second resin layer.

8. A method for fabricating a printed circuit board in accordance with claim 1, wherein the resin layer and the second resin layer have different bulk capacitive, conductive and magnetic properties.

9. A method for fabricating a printed circuit board, the method comprising the steps of:
    depositing a first resin layer formed of a first photo-definable resin onto a substrate;
    patterning the first resin layer so as to at least partially cross-link a portion thereof;
    developing a first opening in the first resin layer by removing portions of the first resin layer that were not cross-linked during the patterning step;
    depositing a second resin layer formed of a second photo-definable resin onto the first resin layer;
    patterning the second resin layer so as to partially cross-link a portion thereof;
    developing a second opening in the second resin layer by removing portions of the second resin layer that were not cross-linked during the patterning step, the portion of the second resin layer that was cross-linked during the patterning step remaining to form a dielectric layer on the substrate, the second opening being superimposed over the first opening;
    plating a conductor pattern onto an area on the first resin layer exposed by the second opening; and
    heating at a temperature and for a time sufficient to cure said first resin layer and said second resin layer, said heating being carried out at superatmospheric pressure so as to form a substantially polymerized monolithic structure.

10. A method for fabricating a printed circuit board in accordance with claim 9, wherein the step of heating produces a lip in the second resin layer, said lip extending onto an exposed surface of the conductor pattern.

11. A method for fabricating a printed circuit board in accordance with claim 9, wherein the step of heating is carried out at a pressure above about 1 Mega Pascal.

12. A method for fabricating a printed circuit board in accordance with claim 9, wherein the step of heating is carried out at a pressure above about 2 Mega Pascal.

13. A method for fabricating a printed circuit board in accordance with claim 9, wherein the step of heating is carried out at above about 100° C.

14. A method for fabricating a printed circuit board in accordance with claim 9, wherein the developing step results in the second opening being larger than the first opening.

15. A method for fabricating a printed circuit board in accordance with claim 9, wherein the first resin layer contains a catalytic filler, the method further comprising the step of treating a surface region of the first dielectric layer exposed by the second opening prior to electroless plating so as to change the surface texture of the area of the first resin layer exposed by the second opening.

16. A method for fabricating a printed circuit board in accordance with claim 15, further comprising the step of treating a surface region of the first resin layer exposed by the second opening, prior to electroless plating, so as to form thereon a catalytic film for electroless plating on the surface region of the first resin layer exposed by the second opening.

17. A method for fabricating a printed circuit board in accordance with claim 9, wherein each of the steps of depositing and patterning the first resin layer and the second resin layer and developing the openings in the first resin layer and the second resin layer are performed simultaneously on opposing surfaces of the substrate.

18. A method for fabricating a printed circuit board in accordance with claim 9, wherein the first and second resin layers have different bulk capacitive, conductive and magnetic properties.

19. A method for fabricating a printed circuit board, the method comprising the steps of:
   formulating first and second photodefinable resin layers containing photo initiators, at least one of the first and second photodefinable resin layers containing metal oxide particles that are convertible to form an electroless plating catalyst;
   depositing the first photodefinable resin layer onto a substrate;
   patterning the first photodefinable resin layer so as to partially cross-link a portion thereof;
   depositing the second photodefinable resin layer onto the first photodefinable resin;
   patterning the second photodefinable resin layer so as to at least partially cross-link a portion thereof;
   simultaneously developing an opening in the first photodefinable resin layer and an opening in the second photodefinable resin layer by removing portions of the first and second photodefinable resin layers that were not cross-linked during the patterning steps, the portions of the first and second photodefinable resin layers that were cross-linked during the patterning steps remaining to form first and second permanent dielectric layers, respectively, on the substrate, the opening in the second photodefinable resin layer exposing the opening in the first photodefinable resin layer;
   converting the metal oxide particles at a surface region of at least one of the first and second photodefinable resin layers to form thereon a catalytic film;
   electrolessly plating the surface region of the catalytic film; and
   heating at a temperature and for a time sufficient to cure the first and second photodefinable resin layers, said heating being carried out at a superatmospheric pressure above about 1 MPa so as to form a substantially polymerized monolithic structure.

20. A method for fabricating a printed circuit board in accordance with claim 19, wherein the step of heating produces a lip in the second resin layer, said lip extending onto an exposed surface of the conductor pattern.

21. A method for fabricating a printed circuit board in accordance with claim 19, further comprising the step of forming a metal region on the substrate prior to depositing the first photodefinable resin layer thereon, wherein the opening in the first photodefinable resin layer exposes the metal region.

22. A method for fabricating a printed circuit board in accordance with claim 19, wherein the second photodefinable resin layer does not contain metal oxide particles, the converting and plating steps resulting in the metallization being formed on surfaces of the first photodefinable resin layer exposed by the opening in the second photodefinable resin layer and not on surfaces of the second photodefinable resin layer.

23. A method for fabricating a printed circuit board in accordance with claim 19, wherein each of the steps of depositing and patterning the first and second photodefinable resin layers and simultaneously developing the openings in the first and second photodefinable resin layers are performed simultaneously on opposing surfaces of the substrate.

24. A method for fabricating a printed circuit board in accordance with claim 19, wherein the first and second photodefinable resin layers have different bulk capacitive, conductive and magnetic properties.

* * * * *